US00RE50258E

(19) United States
(12) Reissued Patent
Chen et al.

(10) Patent Number: US RE50,258 E
(45) Date of Reissued Patent: Dec. 31, 2024

(54) PROJECTION DEVICE

(71) Applicant: Coretronic Corporation, Hsin-Chu (TW)

(72) Inventors: Jhih-Hao Chen, Hsin-Chu (TW); Wei-Min Chien, Hsin-Chu (TW); Tsung-Ching Lin, Hsin-Chu (TW); Shi-Wen Lin, Hsin-Chu (TW)

(73) Assignee: Coretronic Corporation, Hsin-Chu (TW)

(21) Appl. No.: 17/693,463

(22) Filed: Mar. 14, 2022

Related U.S. Patent Documents

Reissue of:
(64) Patent No.: 10,827,153
Issued: Nov. 3, 2020
Appl. No.: 16/703,888
Filed: Dec. 5, 2019

(30) Foreign Application Priority Data

Dec. 6, 2018 (CN) ..... 201811485524.9

(51) Int. Cl.
*H04N 9/31* (2006.01)
*G03B 21/14* (2006.01)
*G03B 21/16* (2006.01)
*H05K 7/20* (2006.01)

(52) U.S. Cl.
CPC ..... *H04N 9/3144* (2013.01); *G03B 21/145* (2013.01); *G03B 21/16* (2013.01); *H05K 7/20163* (2013.01); *H05K 7/20409* (2013.01)

(58) Field of Classification Search
CPC .. H04N 9/3144; H04N 9/3164; H04N 9/3173; G03B 21/145; G03B 21/16; H05K 7/20163; H05K 7/20409
See application file for complete search history.

(56) References Cited

U.S. PATENT DOCUMENTS 9,778,552 B2 10/2017 Yamaguchi
2012/0307212 A1 12/2012 Enomoto et al.
2016/0330419 A1* 11/2016 Lin ..... H04N 9/3144
(Continued)

FOREIGN PATENT DOCUMENTS

CN 1573530 A 2/2005
CN 1854885 A 11/2006
CN 101726974 A 6/2010
(Continued)

OTHER PUBLICATIONS

The second Office Action, dated Sep. 10, 2024, in counterpart China Application No. 202210245039.4.

*Primary Examiner* — Kenneth Whittington

(57) ABSTRACT

A projection device includes a light source module, an optical engine module, a projection lens, a housing, and at least one first heat dissipating element. The housing comprises a first end and a second end opposite to each other. The at least one first heat dissipating element is disposed in the housing, and each of the at least one first heat dissipating element includes a first plate portion, a second plate portion, and a first fin portion. The first plate portion is connected to the light source module. The second plate portion is connected to the first plate portion. The first fin portion is connected to the second plate portion and includes a plurality of first fins arranged at intervals. These first fins are arranged between the first end and the second end.

36 Claims, 6 Drawing Sheets

Amended

(56) References Cited

U.S. PATENT DOCUMENTS

| | | | | |
|---|---|---|---|---|
| 2018/0059521 | A1* | 3/2018 | Nishimori | F21V 29/713 |
| 2019/0079374 | A1* | 3/2019 | Watanabe | F21V 29/67 |

FOREIGN PATENT DOCUMENTS

| | | | |
|---|---|---|---|
| CN | 201540442 | U | 8/2010 |
| CN | 103324013 | A | 9/2013 |
| CN | 203632781 | U | 6/2014 |
| CN | 204331264 | U | 5/2015 |
| CN | 104914543 | A | 9/2015 |
| CN | 105842968 | A | 8/2016 |
| CN | 105988267 | A | 10/2016 |
| CN | 205750251 | U | 11/2016 |
| CN | 106444237 | A | 2/2017 |
| CN | 206178327 | U | 5/2017 |
| CN | 206671742 | U | 11/2017 |
| CN | 108368997 | A | 8/2018 |
| CN | 209265159 | U | 8/2019 |
| CN | 111290203 | A | 6/2020 |
| JP | 2009109738 | A | 5/2009 |
| JP | 2011158862 | A | 8/2011 |
| JP | 2016126250 | A | 7/2016 |
| KR | 2010-0121973 | * | 11/2010 |

* cited by examiner

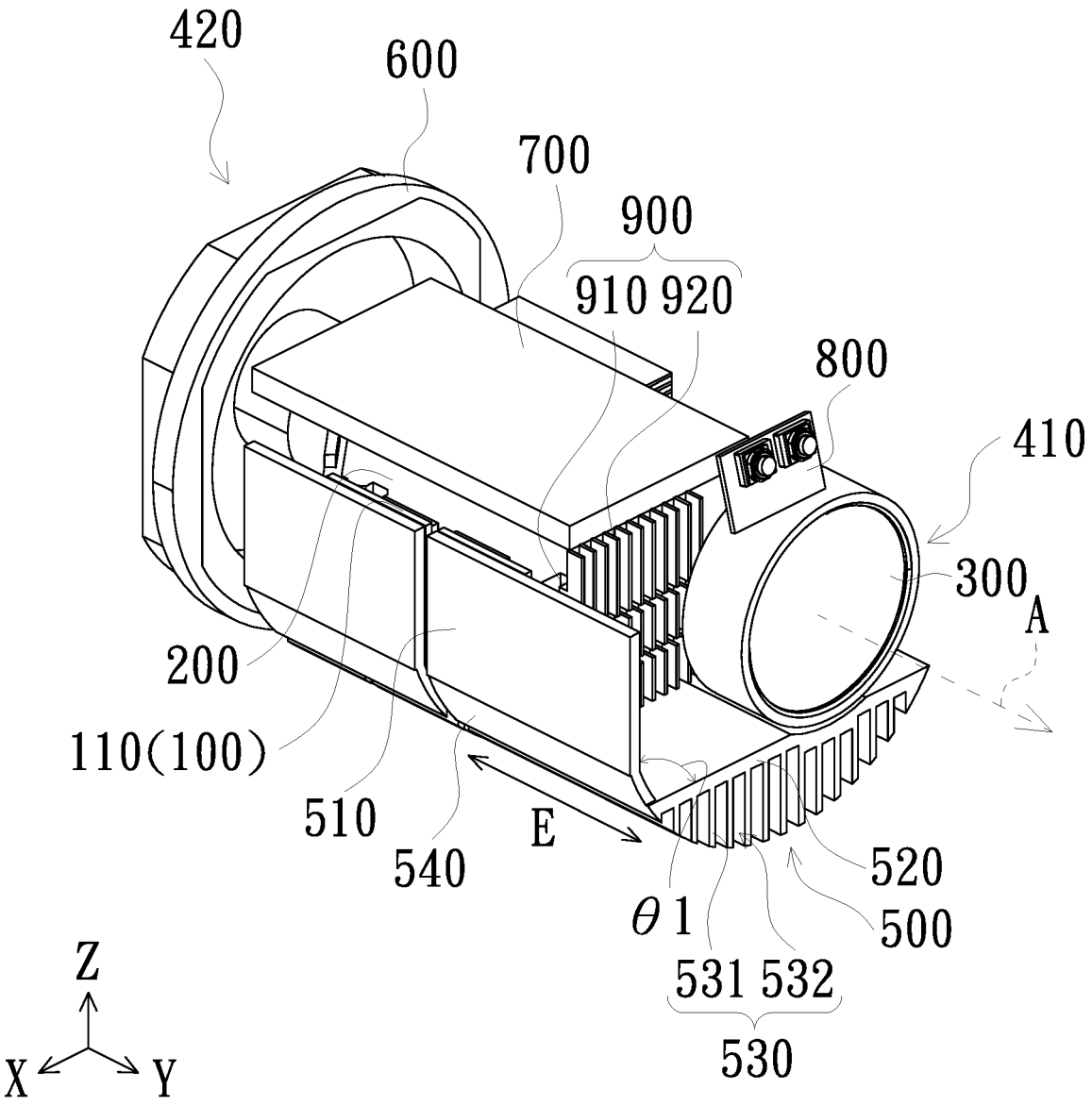
FIG. 3
Amended

PROJECTION DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATION

This application claims the priority benefit of China application CN201811485524.9, filed on 2018 Dec. 6. Access code is C7C9. The entirety of the above-mentioned patent application is hereby incorporated by reference herein and made a part of this specification.

FIELD OF THE INVENTION

The invention relates to a display device, and more particularly to a projection device.

BACKGROUND OF THE INVENTION

Projection devices may use optical elements such as light sources, lenses, light valves, etc., so as to output an optical image. With the advancement of technology, the volume of projection devices has been gradually reduced, and portable projection devices have also been developed. Portable projection devices mainly use solid-state light sources, such as light emitting diodes (LEDs), laser diodes (LDs), and the like.

A solid-state light source may be heat-dissipated by way of directly connecting the heat dissipating fins to the back side of the light source, such that the heat energy generated by the light source may be transmitted to the heat dissipating fins by means of heat conduction. However, depending on the design of the projection device, space between the light source and the housing may be insufficient to mount the heat dissipation fins.

The information disclosed in this "BACKGROUND OF THE INVENTION" section is only for enhancement understanding of the background of the invention and therefore it may contain information that does not form the prior art that is already known to a person of ordinary skill in the art. Furthermore, the information disclosed in this "BACKGROUND OF THE INVENTION" section does not mean that one or more problems to be solved by one or more embodiments of the invention were acknowledged by a person of ordinary skill in the art.

SUMMARY OF THE INVENTION

The invention provides a projection device, which may achieve preferable heat dissipation effects for a light source in case that the space between the light source and the housing is limited.

Other advantages and objects of the invention may be further illustrated by the technical features broadly embodied and described as follows.

In order to achieve one or a portion of or all of the objects or other objects, a projection device provided in an embodiment of the invention includes a light source module, an optical engine module, a projection lens, a housing, and at least one first heat dissipating element. The light source module is used to emit an illumination beam. The optical engine module is disposed on a transmission path of the illumination beam to receive the illumination beam and convert the illumination beam into an image beam. The projection lens is disposed on a transmission path of the image beam to receive the image beam and project the image beam outside of the projection device. The housing is configured to accommodate the light source module, the optical engine module, and the projection lens. The housing comprises a first end and a second end opposite to each other. The image beam is projected from the first end to the outside of the projection device. The housing further comprises an inlet adjacent the first end and an outlet adjacent the second end. The at least one first heat dissipating element is disposed in the housing, and each of the at least one first heat dissipating element includes a first plate portion, a second plate portion, and a first fin portion. The first plate portion is connected to the light source module. The second plate portion is connected to the first plate portion and positioned to form a first angle with respect to the first plate portion. The first fin portion is connected to the second plate portion and includes a plurality of first fins arranged at intervals. The plurality of first fins is arranged between the first end and the second end.

*In order to achieve one or a portion of or all of the objects or other objects, a projection device provided in an embodiment of the invention includes a light source module, an optical engine module, a projection lens, a housing, and at least one first heat dissipating element. The light source module is used to emit an illumination beam. The optical engine module is disposed on a transmission path of the illumination beam to receive the illumination beam and convert the illumination beam into an image beam. The projection lens is disposed on a transmission path of the image beam to receive the image beam and project the image beam outside of the projection device. The housing is configured to accommodate the light source module, the optical engine module, and the projection lens. The housing comprises a first end and a second end opposite to each other. The image beam is projected from the first end to the outside of the projection device. The housing further comprises an inlet adjacent the first end and an outlet adjacent the second end. The at least one first heat dissipating element is disposed in the housing, and the at least one first heat dissipating element includes a first plate portion, a second plate portion, and a first fin portion. The first plate portion is connected to the light source module. The second plate portion is connected to the first plate portion and positioned to form a first angle with respect to the first plate portion. The first fin portion includes a plurality of first fins. The plurality of first fins is disposed between the first end and the second end.*

*In order to achieve one or a portion of or all of the objects or other objects, an embodiment of a projection device is provided. The projection device comprises a light source module, an optical engine module, a projection lens, a housing, and at least one first heat dissipating element. The light source module is configured to emit an illumination beam. The optical engine module is disposed on a transmission path of the illumination beam to receive the illumination beam and convert the illumination beam into an image beam. The projection lens is disposed on a transmission path of the image beam to receive the image beam and project the image beam to an outside of the projection device. The housing is configured to accommodate the light source module, the optical engine module, and the projection lens. The housing comprises a first end and a second*

*end opposite to each other. The image beam is projected from the first end to the outside of the projection device. The housing further comprises an inlet adjacent the first end and an outlet adjacent the second end. The at least one first heat dissipating element is disposed in the housing. The at least one first heat dissipating element comprises a plate portion and a first fin portion. The plate portion is connected to the light source module. The plate portion comprises a first portion and a second portion. An angle is formed between the first portion and the second portion. The at least one first heat dissipating element comprises a plurality of first fins. The plurality of first fins is disposed between the first end and the second end. The housing comprises a tubular portion. Two ends of the tubular portion are respectively the first end and the second end. The inlet comprises a plurality of openings, and the plurality of openings is disposed to be at the tubular portion and at least partially surrounding the housing. The outlet comprises a plurality of openings, and the plurality of openings is disposed to be at the tubular portion and at least partially surrounding the housing.*

In the projection device of the embodiment of the invention, the light source module is connected to the first plate portion of the first heat dissipating element. The second plate portion is connected to the first plate portion and positioned to form a first angle with respect to the first plate portion. The first fin portion is connected to the second plate portion, that is, the light source module and the first fin portion are connected via a bent structure between the first plate portion and the second plate portion. The first fin portion is not directly connected to the back side of the light source module. When the space between the light source module and the housing is limited, the heat generated by the light source module can be transmitted to the second plate portion and the first fin portion by the first plate portion disposed between the light source module and the housing, so that a preferable heat-dissipation effect may be achieved for the light source module. In addition, since the direction of the airflow (from the second end to the outside) is different from the direction of the image beam (from the first end to the outside), hot air can be prevented from affecting the quality of the image.

Other objectives, features and advantages of [The] *the* invention will be further understood from the further technological features disclosed by the embodiments of [The] *the* invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3 is a schematic perspective view of elements in a housing of a projection device of one embodiment of the invention.

DETAILED DESCRIPTION OF PREFERRED EMBODIMENTS

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "front", "back", etc., is used with reference to the orientation of the Figure(s) being described The components of the invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The use of "including", "comprising", or "having" and variations thereof herein is meant to encompass the items listed thereafter and equivalents thereof as well as additional items. Unless limited otherwise, the terms "connected", "coupled", and "mounted" and variations thereof herein are used broadly and encompass direct and indirect connections, couplings, and mountings. Similarly, the terms "facing", "faces", and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component facing "B" component directly or one or more additional components is between "A" component and "B" component. Also, the description of "A" component "adjacent to" "B" component herein may contain the situations that "A" component is directly "adjacent to" "B" component or one or more additional components is between "A" component and "B" component. Accordingly, the drawings and descriptions will be regarded as illustrative in nature and not as restrictive.

Figure 1:
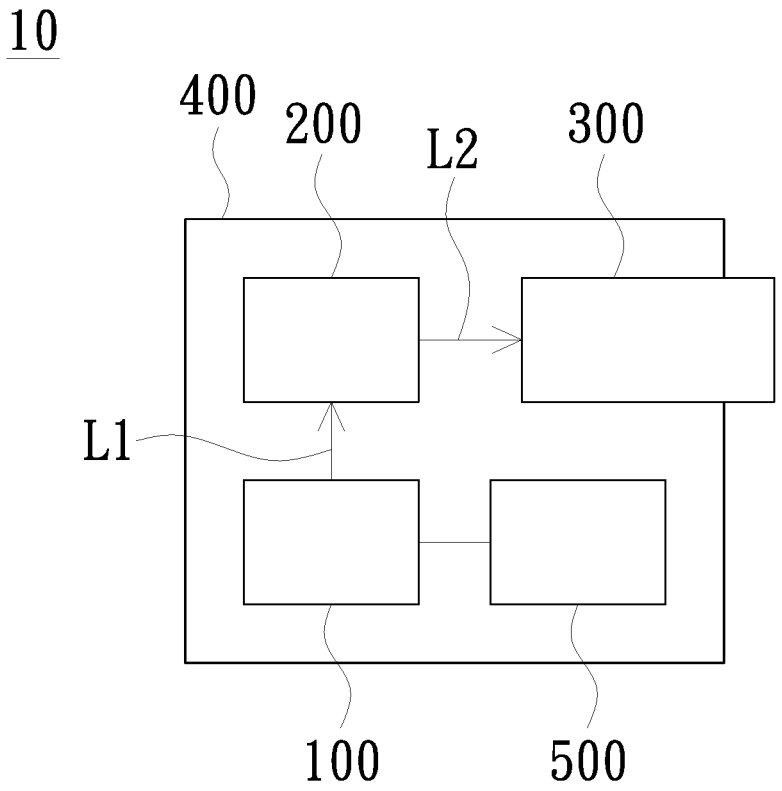
FIG. 1 is a schematic block diagram of a projection device of one embodiment of the invention.

FIG. 1 is a schematic block diagram of a projection device of one embodiment of the invention. Referring to FIG. 1, a projection device 10 of the embodiment includes a light source module 100, an optical engine module 200, a projection lens 300, a housing 400, and at least one first heat dissipating element 500. The light source module 100 is used to emit an illumination beam L1. The optical engine module 200 is disposed on the transmission path of the illumination beam L1 to receive the illumination beam L1 and convert the illumination beam L1 into an image beam L2. The projection lens 300 is disposed on the transmission path of the image beam L2 to receive the image beam L2 and project the image beam L2 to the outside of the projection device 10. The housing 400 is configured to accommodate the light source module 100, the optical engine module 200, and the projection lens 300. The at least one first heat dissipating element 500 is disposed in the housing 400 and connected to the light source module 100.

The light source module 100 includes, for example, a light emitting diode (LED), a laser diode (LD), or other types of solid-state light sources. For example, the light source module 100 includes, for example, a plurality of laser elements arranged in an array, and the laser elements may be, for example, laser diodes. In other embodiments, a plurality of light source modules 100 can be provided.

The optical engine module 200 includes a light valve (not shown) to convert the illumination beam L1 into the image beam L2. The light valve can be a transmissive light valve or a reflective light valve. The transmissive light valve may include a transmissive liquid crystal panel, and the reflective light valve may include a digital micro-mirror device (DMD) or a liquid crystal on silicon (LCOS) panel, but the invention is not limited thereto. The optical engine module 200 may, for example, also include other optical elements, such as a light homogenizing element, a lens, a wheel such as a filter wheel or a light wavelength conversion wheel used to convert the illumination beam L1 into different color beams in time series.

The projection lens 300 includes, for example, a combination of one or more optical lenses of various diopters, such as biconcave lenses, lenticular lenses, meniscus lenses, convex-concave lenses, plano-convex lenses, and plano-concave lenses. In an embodiment, the projection lens 300 may also include a planar optical lens. The invention does not limit the type and kind of projection lens 300. Hereinafter, the structure of the projection device 10 will be described in more detail.

Figure 2:
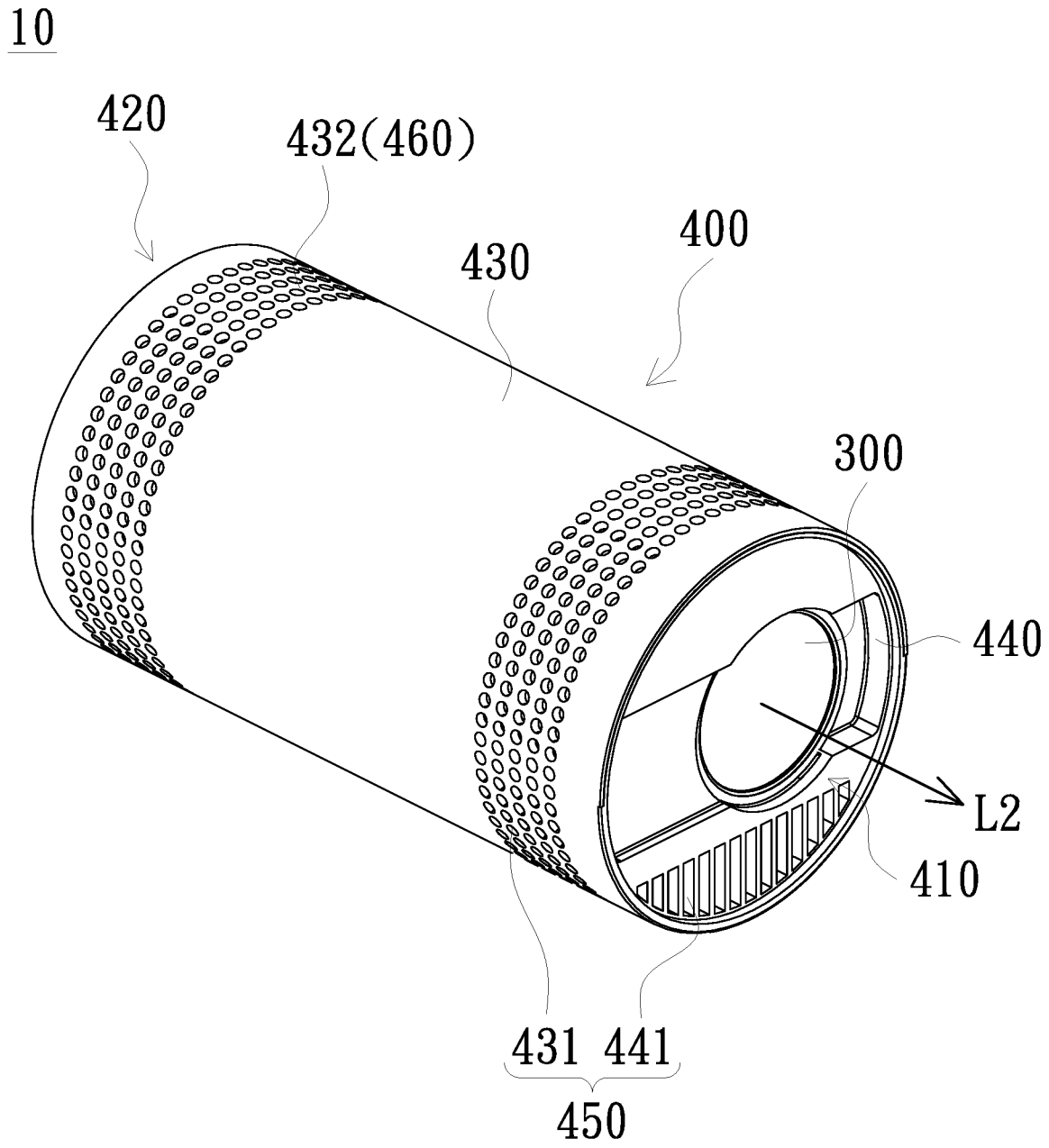
FIG. 2 is a schematic perspective view of a projection device of one embodiment of the invention.

FIG. 2 is a schematic perspective view of a projection device of one embodiment of the invention. FIG. 3 is a schematic perspective view of elements in a housing of a projection device of one embodiment of the invention. Referring to FIG. 2 and FIG. 3, the housing 400 of the embodiment comprises a first end 410 and a second end 420 opposite to each other. The image beam L2 is projected from the first end 410 to the outside of the projection device 10. The housing 400 includes, for example, a tubular portion 430 and a cover portion 440. Two ends of the tubular portion 430 are respectively the first end 410 and the second end 420. The tubular portion 430 of the embodiment is, for example, a cylinder, but the invention is not limited thereto. The cover portion 440 is disposed at the first end 410 of the tubular portion 430 and has a shape corresponding to the tubular portion 430. For example, the tubular portion 430 of the embodiment is a cylinder, and the shape of the cover portion 440 is a circular shape corresponding to the cylinder.

The housing 400 further comprises an inlet 450 adjacent the first end 410 and an outlet 460 adjacent the second end 420. The inlet 450 may include a plurality of openings, such as a plurality of openings 431 disposed at the tubular portion 430 and surrounding the projection lens 300, and/or disposed at the cover portion 440. The inlet 450 in FIG. 2 is exemplified by openings 431 and openings 441. The openings 431 and 441 in FIG. 2 are illustrated as round holes, but the invention is not limited thereto. In other embodiments, the inlet 450 may include only the openings 431 or only the openings 441. In addition, the inlet 450 may include other forms of openings, such as strip holes, disposed adjacent to the first end 410. The outlet 460 includes, for example, a plurality of openings 432 disposed at the tubular portion 430 and surrounding the second end 420, but the invention is not limited thereto. The forms of the openings 432 include, for example, round holes or strip holes in FIG. 2.

The first heat dissipating elements 500 are disposed in the housing 400, and each of the first heat dissipating elements 500 includes a first plate portion 510, a second plate portion 520, and a first fin portion 530. The material of the first heat dissipating element 500 includes, for example, metal (such as aluminum, copper), alloy, or other material with preferable heat conducting effect. The first heat dissipating elements 500 surround the optical engine module 200 and are disposed on a side of the projection lens 300. The first plate portion 510 is connected to the light source module 100. The second plate portion 520 is connected to the first plate portion 510 and positioned to form a first angle θ1 with respect to the first plate portion 510. For example, the first angle θ1 may be in the range of 30°-150°. The first fin portion 530 is connected to the second plate portion 520 and includes a plurality of first fins 531 arranged at intervals. The first fins 531 are arranged between the first end 410 and the second end 420. In some embodiments, the first fin portion 530 is arranged such that the first fins 531 are disposed adjacent to the projection lens 300, and the second plate portion 520 is positioned between the projection lens 300 and the first fin portion 530. In other embodiments, the second plate portion 520 may be otherwise arranged such that the first fins 531 are disposed adjacent to the projection lens 300, and the first fins 531 are positioned between the projection lens 300 and the second plate portion 520. In the embodiment, for example, the second plate portion 520 may be in a shape of a curved plate and may be disposed between the first fin portion 530 and the housing 400.

Figure 4A:
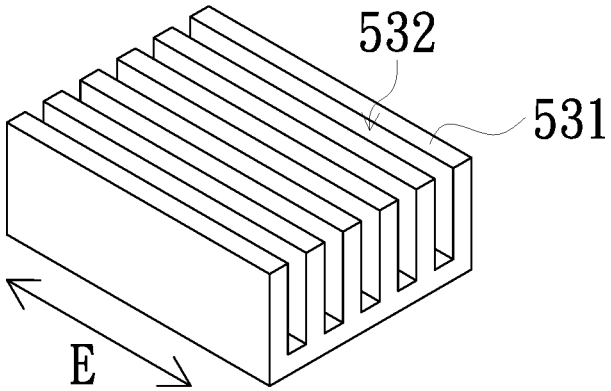
FIG. 4A is a schematic perspective view of first fins of one embodiment of the invention.
Figure 4B:
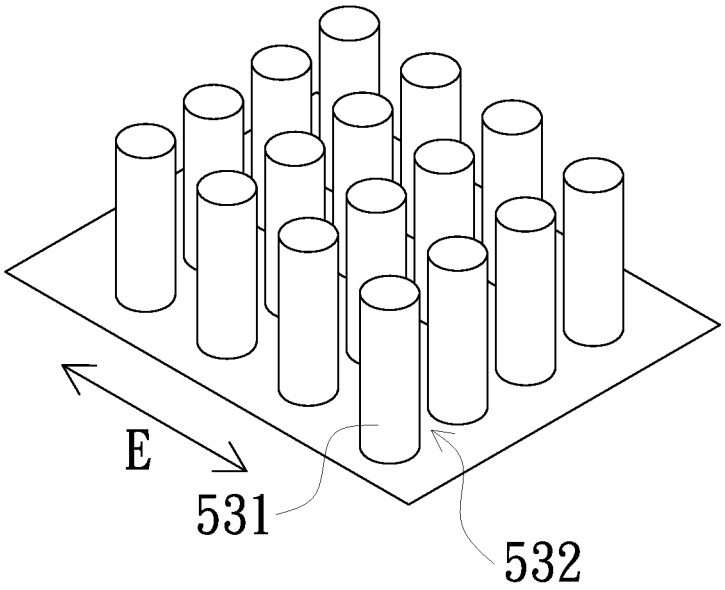
FIG. 4B is a schematic perspective view of first fins of another embodiment of the invention.

The first fins 531 may be sheet-shaped (as shown in FIG. 4A), but the invention is not limited thereto. The extension direction E of the first fins 531 and the optical axis A of the projection lens 300 passing through the first end 410 may be positioned to form an angle ranging from 90° to 180°. Referring to FIG. 2 and FIG. 3, for example, in the embodiment, the extension direction E of the first fins 531 is parallel to the optical axis A of the projection lens 300 passing through the first end 410. The first fins 531 extend between the first end 410 and the second end 420. Flow passages 532 are formed between the plurality of first fins 531 to allow an airflow to flow from the first end 410 to the second end 420. Moreover, in the embodiment, the direction in which the airflow flows from the first end 410 to the second end 420 is defined as a heat dissipation direction. In the embodiment of FIG. 4A, the heat dissipation direction is parallel to the extension direction E of the first fins 531. In other embodiments, the angle between the heat dissipation direction and the optical axis A of the projection lens 300 may be in the range of 90°-180°. For example, the heat dissipation direction may be parallel to the optical axis A of the projection lens 300. However, the invention is not limited thereto. In other embodiments of the invention, for example, in the case where the extension direction E of the first fins 531 is positioned to form an angle of 90° with respect to the optical axis A of the projection lens 300, the heat dissipation direction from the first end 410 to the second end 420 can be achieved by, for example, the fan 600 in FIG. 3, and thus the heat dissipation direction can be perpendicular to the extension direction E of the first fins 531. As shown in FIG. 2 and FIG. 3, in the embodiment, the plurality of strip holes 441 provided at the cover portion 440 correspond to, for example, the position of the first fin portions 530, so that the airflow can flow directly through the plurality of strip holes 441 to the first fin portions 530, and flow from the first end 410 to the second end 420 via the flow passages 532 between the plurality of first fins 531 for heat exchange. In addition, the first fins 531 in FIG. 4A may also be replaced by columnar first fins 531 (as shown in FIG. 4B). The columnar first fins 531 may be cylinder, triangular column, rectangular column, or the like. FIG. 4B is exemplified by cylinder columns, but the invention is not limited thereto. The first fins 531 may be arranged in a plurality of rows, and each row may be arranged along the extension direction E or across the extension direction E.

The housing 400 in the embodiment is a cylinder, and each of the first heat dissipating elements 500 further has, for example, the following designs corresponding to its shape: (1) The first heat dissipating element 500 includes a first curved transition portion 540 connected between the first plate portion 510 and the second plate portion 520; (2) Heights of the plurality of first fins 531 with respect to the second plate portion 520 are different. Specifically, as shown in FIG. 3, in the XZ plane, the heights of the plurality of first fins 531 with respect to the second plate portion 520 are gradually reduced from the middle to both sides. The first fin portion 530 as a whole exhibits a curved shape corresponding to the cylinder. The above designs only serve to illustrate that the first heat dissipating elements 500 can be designed and adjusted corresponding to the shape of the housing 400, and are not intended to limit the shape of the first heat dissipating elements 500.

Figure 5:
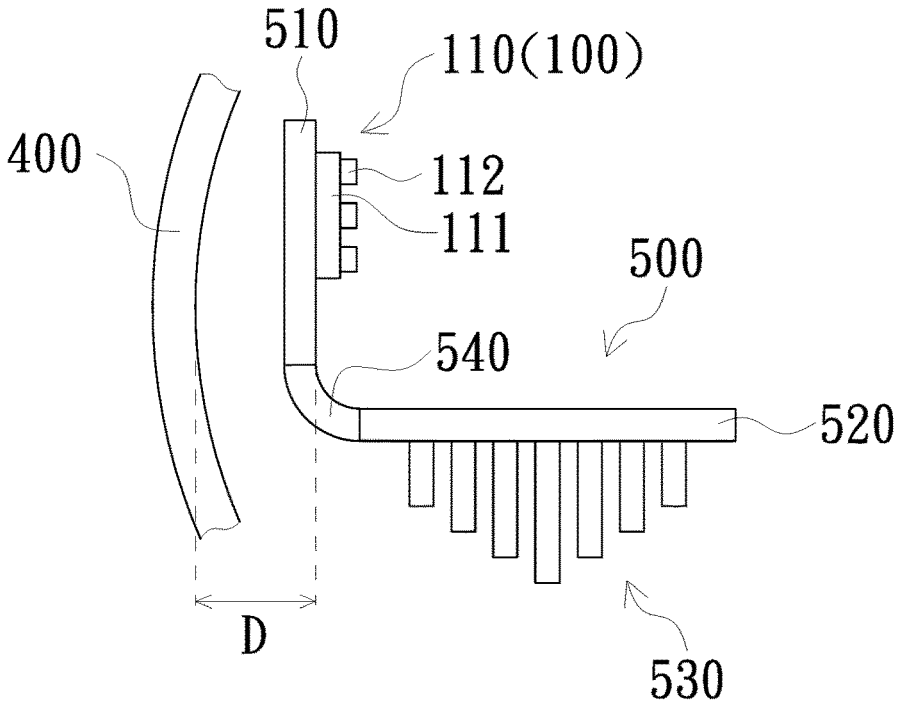
FIG. 5 is a schematic cross-sectional view of a first light source assembly and a first plate portion in a housing.

FIG. 5 is a schematic cross-sectional view of a first light source assembly and a first plate portion in a housing. Referring to FIG. 3 and FIG. 5, the light source module 100 of the embodiment includes at least one first light source assembly 110, and each of the first light source assemblies 110 includes a first substrate 111 and at least one first solid-state light source 112 disposed on the first substrate 111. The quantity of the first solid-state light sources 112 in FIG. 5 is illustrated as three, but the invention is not limited thereto. The quantity of the first light source assemblies 110 may be the same as or different from the quantity of the first heat dissipating elements 500, and the invention is not limited thereto. For example, the quantity of the first light source assemblies 110 may be set such that one heat dissipating element is connected to two light source assemblies, or two heat dissipating elements are connected to one light source assembly. The first plate portion 510 of each of the first heat dissipating elements 500 is connected to the first substrate 111 and disposed between the first substrate 111 and the housing 400. Specifically, the smallest distance D between the first substrate 111 and the housing 400 (a tubular portion in this embodiment) is less than or equal to 20 mm.

Referring to FIG. 3, the projection device 10 may additionally include, for example, a fan 600, a circuit board 700, and other functional elements. The fan 600 is, for example, an axial fan, but the invention is not limited thereto. The quantity of the fan 600 may be one or more. The fan 600 is disposed between the first end 410 and the second end 420. For example, the fan 600 in FIG. 3 is disposed between the light source module 100 and the second end 420. In another embodiment, the fan 600 may be disposed between the light source module 100 and the first end 410. Specifically, the fan 600 may be disposed adjacent to the first fin portion 530. Alternatively, the fan 600 may be disposed both between the light source module 100 and the first end 410 and between the light source module 100 and the second end 420. The fan 600 is used to provide an airflow from the first end 410 to the second end 420. The circuit board 700 is electrically connected to the light source module 100 and the optical engine module 200 (not shown in FIG. 3), and is used to control and adjust the operations of the light source module 100 and the optical engine module 200. In other embodiments, the projection device 10 can additionally include other elements (e.g. a camera module 800) to meet different design requirements. The projection lens 300 is disposed between the camera module 800 and the first heat dissipating element 500. That is, the first heat dissipating element 500 is disposed under the projection lens 300.

In the projection device 10 of the embodiment, the first substrate 111 in the light source module 100 is connected to the first plate portion 510 of the first heat dissipating element 500. The second plate portion 520 is connected to the first plate portion 510 and positioned to form a first angle θ1 with respect to the first plate portion 510. The first fin portion 530 is connected to the second plate portion 520. That is, the first substrate 111 and the first fin portion 530 are connected by a bent structure between the first plate portion 510 and the second plate portion 520, and the first fin portion 530 is not directly connected to the back side of the light source module 100. When the space between the light source module 100 and the housing 400 is limited, the heat generated by the light source module 100 can be transmitted to the second plate portion 520 and the first fin portion 530 by the first plate portion 510 disposed between the light source module 100 and the housing 400, so that the light source module 100 can have a preferable heat dissipation effect. In addition, since the direction in which the wind is output (from the second end 420 to the outside) is different from the direction in which the image beam L2 is emitted (from the first end 410 to the outside), the hot wind can be prevented from affecting the quality of the image.

Figure 6:
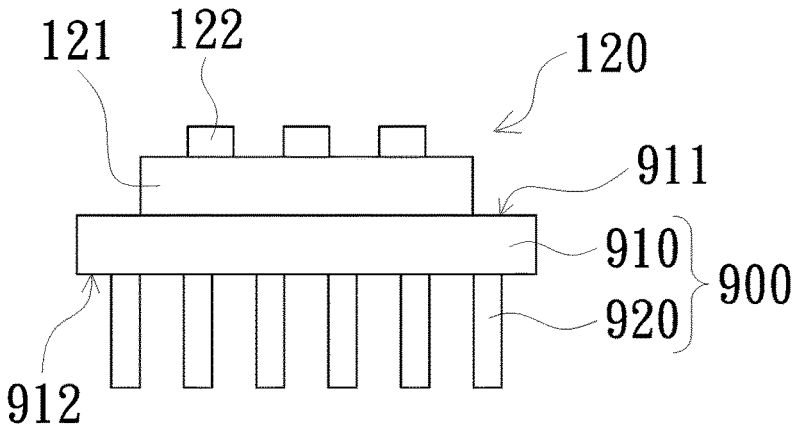
FIG. 6 is a schematic cross-sectional view of a second light source assembly and a second heat dissipating element of one embodiment of the invention.

FIG. 6 is a schematic cross-sectional view of a second light source assembly and a second heat dissipating element of one embodiment of the invention. Referring to FIG. 3 and FIG. 6, the light source module 100 further includes, for example, a second light source assembly 120. The second light source assembly 120 includes a second substrate 121 and at least one second solid-state light source 122 disposed on the second substrate 121. The quantity of the second solid-state light sources in FIG. 6 is illustrated as three, but the invention is not limited thereto. The projection device 10 further includes, for example, a second heat dissipating element 900. The second heat dissipating element 900 includes a plate portion 910 and a fin portion 920. The plate portion 910 comprises a first surface 911 and a second surface 912 opposite to each other. The first surface 911 is connected to the second substrate 121, and the fin portion 920 is connected to the second surface 912. The fins of the fin portion 920 may also be in a shape of a sheet or a column as shown in FIG. 4A and FIG. 4B. In the embodiment, the fins of the fin portion 920 are, for example, sheet-shaped.

Figure 7:
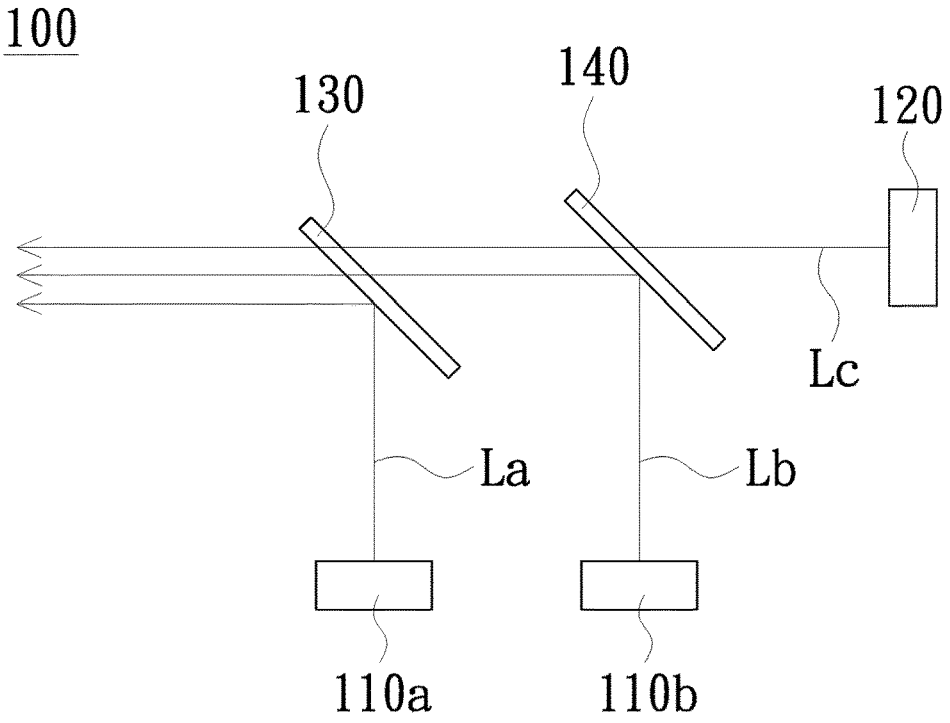
FIG. 7 is a schematic diagram of a light path of a light source module of one embodiment of the invention.

The first light source assembly 110 and the second light source assembly 120 are, for example, adapted to emit different colored beams, which are combined in the light source module 100 into the illumination beam L1 and transmitted to the optical engine module 200. The following is an example of the embodiment. FIG. 7 is a schematic diagram of a light path of a light source module of one embodiment of the invention. Referring to FIG. 1 and FIG. 7, in the embodiment, for example, two first light source assemblies 110a, 110b are disposed. The first light source assembly 110a emits a first beam La, the first light source assembly 110b emits a second beam Lb, and the second light source assembly 120 emits a third beam Lc. The colors of the first beam La, the second beam Lb, and the third beam Lc may be the same or different. The combined color combination of the first beam La, the second beam Lb, and the third beam Lc is, for example, a combination of red, green, and blue. However, the invention is not limited to such arrangements and combinations of colors. The light source module 100 further includes, for example, two dichroic mirrors 130, 140. The dichroic mirror 130 is disposed, for example, between the first light source assembly 110a and the dichroic mirror 140, and is adapted to reflect the first beam La and allow the second beam Lb and the third beam Lc to pass therethrough. The dichroic mirror 140 is disposed, for example, between the first light source assembly 110b and the second light source assembly 120, and is adapted to reflect the second beam Lb and allow the third beam Lc to pass therethrough. The illumination beam L1 includes the first beam La, the second beam Lb, and the third beam Lc. In another embodiment, the light source module may also include one first light source assembly 110 of one color, for example, a white beam, and the quantity of the first heat dissipating element 500 corresponds to the quantity of the first light source assembly 110.

Figure 8:
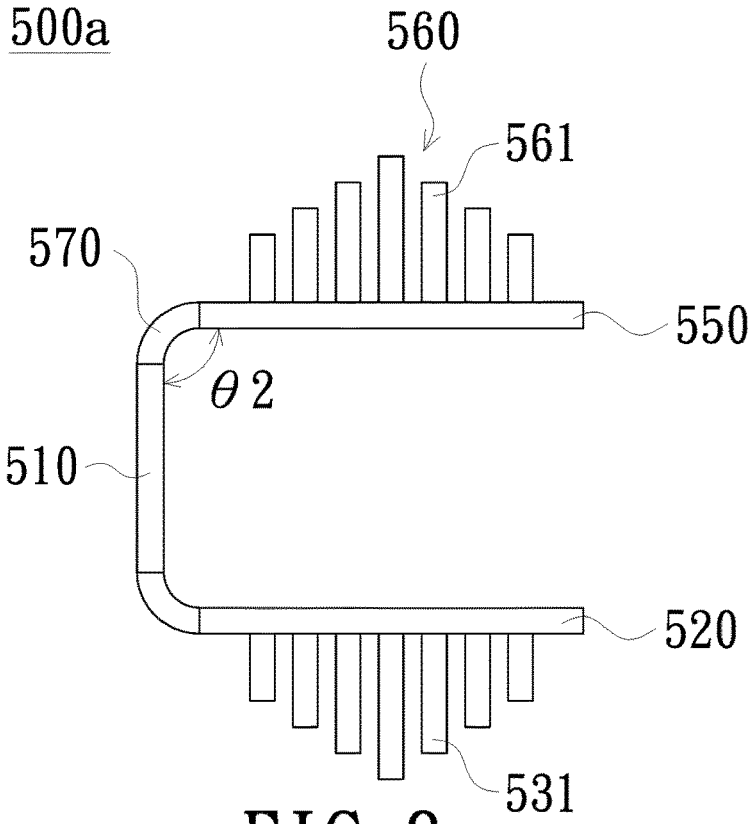
FIG. 8 is a schematic cross-sectional view of a first heat dissipating element according to another embodiment.

FIG. 8 is a schematic cross-sectional view of a first heat dissipating element according to another embodiment. Referring to FIG. 3 and FIG. 8, the first heat dissipating element 500a of the embodiment is similar in structure and advantages to the first heat dissipating element 500 described above. Main differences in the structure will be described below. The first heat dissipating element 500a further includes, for example, a third plate portion 550 and a second fin portion 560. The third plate portion 550 and the second plate portion 520 are respectively connected to opposite sides of the first plate portion 510. The third plate portion 550 is positioned to form a second angle θ2 with respect to the first plate portion 510. For example, the second angle θ2 may be in the range of 30°-150°. The second fin portion 560 is connected to the third plate portion 550 and includes a plurality of second fins 561 arranged at intervals. The second fin is arranged between the first end 410 and the second end 420. The second fin portion 560 is arranged such that the second fins 561 are disposed adjacent to the projection lens 300. The third plate portion 550 is positioned between the projection lens 300 and the second fin portion 560. The second fins 561 are, for example, the same as the first fins 531 described above. When the first heat dissipating element 500a is used in the above-mentioned housing 400, a second curved transition portion 570 is included between the third plate portion 550 and the first plate portion 510. Heights of the plurality of second fins 561 relative to the third plate portion 550 may be gradually reduced from the middle to the two sides. Since the first heat dissipating element 500a further includes the second fin portion 560, the heat dissipation effect can be improved.

In summary, in the projection device of the embodiment of the invention, the first substrate of the light source module is connected to the first plate portion of the first heat dissipating element. The second plate portion is connected to the first plate portion and positioned to form a first angle with respect to the first plate portion. The first fin portion is connected to the second plate portion. That is, the first substrate and the first fin portion are connected by a bent structure between the first plate portion and the second plate portion, and the first fin portion is not directly connected to the back side of the light source module. When the space between the light source module and the housing is limited, the heat generated by the light source module can be transmitted to the second plate portion and the first fin portion by the first plate portion disposed between the light source module and the housing, so that the light source module can have a preferable heat dissipation effect. In addition, since the direction in which the wind is output (from the second end to the outside) is opposite to the direction in which the image beam is emitted (from the first end to the outside), the hot wind can be prevented from affecting the quality of the image.

The foregoing description of the preferred embodiment of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "The invention" or the like is not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the invention as defined by the following claims. Moreover, no element and component in the disclosure is intended to be dedicated to the public regardless of whether the element or component is explicitly recited in the following claims.

Furthermore, the terms such as the first light source assembly, the second light source assembly, the first substrate, the second substrate, the first solid-state light source, the second solid-state light source, the first end, the second end, the first heat dissipating element, the second heat dissipating element, the first plate portion, the second plate portion, the third plate portion, the first fin portion, the second fin portion, the first fin, the second fin, the first surface, the second surface, the first beam, the second beam and the third beam are only used for distinguishing various elements and do not limit the number of the elements.

What is claimed is:

1. A projection device, comprising a light source module, an optical engine module, a projection lens, a housing, and at least one first heat dissipating element, wherein:

the light source module is [used] *configured* to emit an illumination beam;

the optical engine module is disposed on a transmission path of the illumination beam to receive the illumination beam and convert the illumination beam into an image beam;

the projection lens is disposed on a transmission path of the image beam to receive the image beam and project the image beam to an outside of the projection device;

the housing is configured to accommodate the light source module, the optical engine module, and the projection lens, the housing comprises a first end and a second end opposite to each other, the image beam is projected along a direction from the first end to the outside of the projection device, and the housing further comprises an inlet adjacent the first end and an outlet adjacent the second end; and the at least one first heat dissipating element is disposed in the housing, each of the at least one first heat dissipating element comprises a first plate portion, a second plate portion, and a first fin portion, the first plate portion is *directly* connected to the light source module, *the second plate portion is not directly connected to any light source module,* the second plate portion is connected to the first plate portion and positioned to form a first angle with respect to the first plate portion, the first fin portion is connected to the second plate portion and comprises a plurality of first fins arranged at intervals, and the plurality of first fins is arranged between the first end and the second end*;*

*wherein the housing comprises a tubular portion, two ends of the tubular portion are respectively the first end and the second end, and the tubular portion is a cylinder.*

2. The projection device of claim 1, wherein the projection lens has an optical axis, and the plurality of first fins comprises a plurality of sheet fins and/or a plurality of column fins.

3. The projection device of claim 2, wherein the plurality of sheet fins extends between the first end and the second end in a direction of the optical axis of the projection lens, and wherein an angle between an extension direction of the plurality of sheet fins and the optical axis of the projection lens is in a range of 90°-180°.

4. The projection device of claim 3, wherein the extension direction of the plurality of sheet fins is parallel to the optical axis of the projection lens.

5. The projection device of claim 1, wherein the first fin portion is arranged such that the plurality of first fins is disposed adjacent to the projection lens, and the second plate portion is positioned between the projection lens and the first fin portion.

6. The projection device of claim 1, wherein the second [fin] *plate* portion is arranged such that the plurality of first fins is disposed adjacent to the projection lens, and the first fin portion is positioned between the projection lens and the second plate portion.

7. The projection device of claim 1, wherein [the housing comprises a tubular portion, two ends of the tubular portion are respectively the first end and the second end, and] the light source module comprises:

at least one first light source assembly, wherein each of the at least one first light source assembly comprises a first substrate and at least one first solid-state light source disposed on the first substrate, and the first plate portion of each of the at least one first heat dissipating element is connected to the first substrate.

8. The projection device of claim 7, wherein the smallest distance between the first substrate and the tubular portion is less than or equal to 20 mm.

9. The projection device of claim 7, wherein the light source module further comprises a second light source assembly, the second light source assembly comprises a second substrate and at least one second solid-state light source disposed on the second substrate, the projection device further comprises a second heat dissipating element, the second heat dissipating element comprises a plate portion and a fin portion, the plate portion comprises a first surface and a second surface opposite to each other, the first surface is connected to the second substrate, and the fin portion is connected to the second surface.

10. The projection device of claim 7, wherein the [tubular portion is a cylinder,] heights of the plurality of first fins with respect to the second plate portion are different.

11. The projection device of claim 10, wherein each of the at least one first heat dissipating element comprises a first curved transition portion connected between the first plate portion and the second plate portion.

12. The projection device of claim 7, wherein the housing further comprises a cover portion disposed at the first end of the tubular portion, the inlet comprises a plurality of openings, and the plurality of openings are disposed to be [in] *at* the tubular portion and surrounding the projection lens, and/or disposed to be in the cover portion.

13. The projection device of claim 7, wherein the outlet comprises a plurality of openings disposed to be [in] *at* the tubular portion and surrounding the second end.

14. The projection device of claim 1, wherein each of the at least one first heat dissipating element further comprises a third plate portion and a second fin portion, the third plate portion and the second plate portion are respectively connected to opposite sides of the first plate portion, the third plate portion is positioned to form a second angle with respect to the first plate portion, the second fin portion is connected to the third plate portion and comprises a plurality of second fins arranged at intervals, and the plurality of second fins is arranged between the first end and the second end.

15. The projection device of claim 14, wherein the second fin portion is arranged such that the plurality of second fins is disposed adjacent to the projection lens, and the third plate portion is positioned between the projection lens and the second fin portion.

16. The projection device of claim 14, wherein each of the at least one first heat dissipating element further comprises a second curved transition portion connected between the first plate portion and the third plate portion.

17. The projection device of claim 1, further comprising a fan disposed between the first end and the second end, and wherein the fan is used to provide an airflow flowing from the first end toward the second end.

*18. A projection device, comprising a light source module, an optical engine module, a projection lens, a housing, and at least one first heat dissipating element, wherein:*

*the light source module is configured to emit an illumination beam;*

*the optical engine module is disposed on a transmission path of the illumination beam to receive the illumination beam and convert the illumination beam into an image beam;*

*the projection lens is disposed on a transmission path of the image beam to receive the image beam and project the image beam to an outside of the projection device;*

*the housing is configured to accommodate the light source module, the optical engine module, and the projection lens, the housing comprises a first end and a second end opposite to each other, the image beam is projected along a direction from the first end to the outside of the*

*projection device, and the housing further comprises an inlet adjacent the first end and an outlet adjacent the second end; and*

*the at least one first heat dissipating element is disposed in the housing, the at least one first heat dissipating element comprises a first plate portion, a second plate portion, and a first fin portion, the first plate portion is directly connected to the light source module, the second plate portion is not directly connected to any light source module, the second plate portion is connected to the first plate portion and positioned to form a first angle with respect to the first plate portion, the first fin portion comprises a plurality of first fins, and the plurality of first fins is disposed between the first end and the second end;*

*wherein the housing comprises a tubular portion, the first end and the second end are respectively two ends of the tubular portion, and the tubular portion is a cylinder.*

*19. The projection device of claim 18, wherein the projection lens has an optical axis, and the plurality of first fins comprises a plurality of sheet fins and/or a plurality of column fins.*

*20. The projection device of claim 19, wherein the plurality of sheet fins extends between the first end and the second end in a direction of the optical axis of the projection lens.*

*21. The projection device of claim 20, wherein the extension direction of the plurality of sheet fins is parallel to the optical axis of the projection lens.*

*22. The projection device of claim 21, wherein the plurality of sheet fins is arranged along a direction, the direction is perpendicular to the optical axis of the projection lens.*

*23. The projection device of claim 21, wherein the at least one first heat dissipating element partially surrounds the optical engine module.*

*24. The projection device of claim 23, wherein the plurality of first fins does not directly connect to a back side of the light source module.*

*25. The projection device of claim 24, wherein the plurality of first fins is thermally coupled to the second plate portion.*

*26. The projection device of claim 18, wherein the light source module comprises:*

*at least one first light source assembly, wherein each of the at least one first light source assembly comprises a first substrate and at least one first solid-state light source disposed on the first substrate, and the first plate portion of the at least one first heat dissipating element is connected to the first substrate.*

*27. The projection device of claim 26, wherein the smallest distance between the first substrate and the tubular portion is less than or equal to 20 mm.*

*28. The projection device of claim 26, wherein the light source module further comprises a second light source assembly, the second light source assembly comprises a second substrate and at least one second solid-state light source disposed on the second substrate, the projection device further comprises a second heat dissipating element, the second heat dissipating element comprises a plate portion, the plate portion comprises a first surface and a second surface opposite to each other, the first surface is connected to the second substrate.*

*29. The projection device of claim 18, wherein the housing further comprises a cover portion disposed at the first end of the tubular portion, the inlet comprises a plurality of openings, and the plurality of openings is disposed to be at the tubular portion and at least partially surrounding the housing, and/or disposed to be in the cover portion.*

*30. The projection device of claim 18, wherein the outlet comprises a plurality of openings, and the plurality of openings is disposed to be at the tubular portion and at least partially surrounding the housing.*

*31. The projection device of claim 30, wherein the projection lens has an optical axis, the inlet is formed multiple rings arranged along the optical axis.*

*32. The projection device of claim 31, wherein the projection lens has an optical axis, the outlet is formed multiple rings arranged along the optical axis.*

*33. The projection device of claim 31, further comprising a fan disposed near the second end, and wherein the fan is disposed between the optical engine module and the second end, the fan is configured to provide an airflow flowing from the first end toward the second end.*

*34. The projection device, comprising a light source module, an optical engine module, a projection lens, a housing, and at least one first heat dissipating element, wherein:*

*the light source module is configured to emit an illumination beam;*

*the optical engine module is disposed on a transmission path of the illumination beam to receive the illumination beam and convert the illumination beam into an image beam;*

*the projection lens is disposed on a transmission path of the image beam to receive the image beam and project the image beam to an outside of the projection device;*

*the housing is configured to accommodate the light source module, the optical engine module, and the projection lens, the housing comprises a first end and a second end opposite to each other, the image beam is projected from the first end to the outside of the projection device, and the housing further comprises an inlet adjacent the first end and an outlet adjacent the second end; and*

*the at least one first heat dissipating element is disposed in the housing, the at least one first heat dissipating element comprises a plate portion and a first fin portion, and*

*the plate portion comprises a first portion and a second portion, and the first portion is connected to the second portion, wherein an angle is formed between the first portion and the second portion, the first portion is directly connected to the light source module, and the second portion is not directly connected to any light source module,*

*wherein the at least one first heat dissipating element comprises a plurality of first fins, the plurality of first fins is disposed between the first end and the second end,*

*wherein the housing comprises a tubular portion, the first end and the second end are respectively two ends of the tubular portion, and the tubular portion is a cylinder,*

*wherein the inlet comprises a plurality of openings, and the plurality of openings is disposed to be at the tubular portion and at least partially surrounding the housing, and the outlet comprises a plurality of openings, and the plurality of openings is disposed to be at the tubular portion and at least partially surrounding the housing.*

*35. A projection device, comprising a light source module, an optical engine module, a projection lens, a housing, and at least one first heat dissipating element, wherein:*

*the light source module is configured to emit an illumination beam;*

*the optical engine module is disposed on a transmission path of the illumination beam to receive the illumination beam and convert the illumination beam into an image beam;*

*the projection lens is disposed on a transmission path of the image beam to receive the image beam and project the image beam to an outside of the projection device;*

*the housing is configured to accommodate the light source module, the optical engine module, and the projection lens, the housing comprises a first end and a second end opposite to each other, the image beam is projected along a direction from the first end to the outside of the projection device, and the housing further comprises an inlet adjacent the first end and an outlet adjacent the second end; and*

*the at least one first heat dissipating element is disposed in the housing, the at least one first heat dissipating element comprises a first plate portion, a second plate portion, and a first fin portion, the first plate portion is connected to the light source module, the second plate portion is connected to the first plate portion and positioned to form a first angle with respect to the first plate portion, the first fin portion comprises a plurality of first fins, and the plurality of first fins is disposed between the first end and the second end;*

*wherein the housing comprises a tubular portion, two ends of the tubular portion are respectively the first end and the second end, and the light source module comprises:*

*at least one first light source assembly, wherein each of the at least one first light source assembly comprises a first substrate and at least one first solid-state light source disposed on the first substrate, and the first plate portion of each of the at least one first heat dissipating element is connected to the first substrate;*

*wherein the tubular portion is a cylinder, and heights of the plurality of first fins with respect to the second plate portion are different.*

*36. A projection device, comprising a light source module, an optical engine module, a projection lens, a housing, and at least one first heat dissipating element, wherein:*

*the light source module is configured to emit an illumination beam;*

*the optical engine module is disposed on a transmission path of the illumination beam to receive the illumination beam and convert the illumination beam into an image beam;*

*the projection lens is disposed on a transmission path of the image beam to receive the image beam and project the image beam to an outside of the projection device;*

*the housing is configured to accommodate the light source module, the optical engine module, and the projection lens, the housing comprises a first end and a second end opposite to each other, the image beam is projected along a direction from the first end to the outside of the projection device, and the housing further comprises an inlet adjacent the first end and an outlet adjacent the second end; and*

*the at least one first heat dissipating element is disposed in the housing, the at least one first heat dissipating element comprises a first plate portion, a second plate portion, and a first fin portion, the first plate portion is connected to the light source module, the second plate portion is connected to the first plate portion and positioned to form a first angle with respect to the first plate portion, the first fin portion comprises a plurality of first fins, and the plurality of first fins is disposed between the first end and the second end;*

*wherein each of the at least one first heat dissipating element further comprises a third plate portion and a second fin portion, the third plate portion and the second plate portion are respectively connected to opposite sides of the first plate portion, the third plate portion is positioned to form a second angle with respect to the first plate portion, the second fin portion is connected to the third plate portion and comprises a plurality of second fins arranged at intervals, and the plurality of second fins is arranged between the first end and the second end;*

*wherein each of the at least one first heat dissipating element further comprises a second curved transition portion connected between the first plate portion and the third plate portion.*

* * * * *